United States Patent
Radfar et al.

(10) Patent No.: US 11,921,651 B2
(45) Date of Patent: Mar. 5, 2024

(54) INTERFACE MODULE WITH LOW-LATENCY COMMUNICATION OF ELECTRICAL SIGNALS BETWEEN POWER DOMAINS

(71) Applicant: AyDeeKay LLC, Aliso Viejo, CA (US)

(72) Inventors: Mohammad Radfar, Aliso Viejo, CA (US); Scott David Kee, Aliso Viejo, CA (US); Jeffrey Michael Zachan, Aliso Viejo, CA (US); Craig Petku, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 0 days.

(21) Appl. No.: 17/576,702

(22) Filed: Jan. 14, 2022

(65) Prior Publication Data

US 2022/0391335 A1   Dec. 8, 2022

Related U.S. Application Data

(60) Provisional application No. 63/197,637, filed on Jun. 7, 2021.

(51) Int. Cl.
| | | |
|---|---|---|
| *G06F 13/16* | (2006.01) | |
| *G06F 13/38* | (2006.01) | |
| *G06F 13/40* | (2006.01) | |

(52) U.S. Cl.
CPC ........ *G06F 13/1673* (2013.01); *G06F 13/385* (2013.01); *G06F 13/4059* (2013.01)

(58) Field of Classification Search
None
See application file for complete search history.

(56) References Cited

U.S. PATENT DOCUMENTS

| | | | |
|---|---|---|---|
| 9,438,240 B1* | 9/2016 | Gradinariu | G11C 16/06 |
| 9,753,510 B2 | 9/2017 | Bharath et al. | |
| 9,996,138 B2* | 6/2018 | Yang | G06F 1/3296 |
| 2007/0103215 A1* | 5/2007 | Boerstler | H03K 19/018521 |
| | | | 327/175 |
| 2012/0082166 A1 | 4/2012 | Sala et al. | |
| 2014/0006652 A1 | 1/2014 | Chen et al. | |
| 2014/0112061 A1* | 4/2014 | Jung | G11C 11/419 |
| | | | 365/154 |

(Continued)

OTHER PUBLICATIONS

PCT Patent Appl. Serial No. PCT/US22/17788, International Search Report and Written Opinion, dated May 12, 2022.

*Primary Examiner* — Henry Tsai
*Assistant Examiner* — Aurangzeb Hassan
(74) *Attorney, Agent, or Firm* — Steven Stupp (57) ABSTRACT

An integrated circuit is described. This integrated circuit may include: an interface module with a first power domain and a second power domain. The first power domain may include a digital controller, and the second power domain may include a first analog front end (AFE) circuit. Moreover, the interface module may include up/down level shifters that communicate electrical signals that include a DC component from the first power domain to the second power domain. In some embodiments, the integrated circuit may provide a fully on-chip solution to handle level shifting between the AFE circuit and a digital controller in Universal Serial Bus (USB) 2.0 during communication of electrical signals in a full-speed mode and/or a high-speed mode.

18 Claims, 8 Drawing Sheets

(56) References Cited

U.S. PATENT DOCUMENTS

| | | |
|---|---|---|
| 2014/0184300 A1* | 7/2014 | Wu ................ H03K 19/018521 327/333 |
| 2014/0211862 A1 | 7/2014 | Moghe et al. |
| 2014/0281601 A1 | 9/2014 | Patel et al. |
| 2015/0089092 A1 | 3/2015 | Voto et al. |
| 2015/0227489 A1 | 8/2015 | Chen et al. |
| 2015/0363349 A1 | 12/2015 | Remple et al. |
| 2017/0012628 A1* | 1/2017 | Blutman ............ H03K 19/0185 |
| 2017/0293445 A1 | 10/2017 | Jain et al. |
| 2017/0373691 A1* | 12/2017 | Paasio ............ H03K 19/018521 |
| 2018/0032176 A1* | 2/2018 | Krah ..................... G06F 3/0418 |
| 2018/0062512 A1* | 3/2018 | Zhu ........................ H02M 1/38 |
| 2018/0145482 A1* | 5/2018 | Lee .................... H01S 5/06226 |
| 2019/0052254 A1* | 2/2019 | Hess .............. H03K 19/017509 |
| 2019/0079575 A1* | 3/2019 | Hanson ................ G06F 1/3287 |
| 2019/0102037 A1* | 4/2019 | Krah ..................... G06F 3/0418 |
| 2019/0149485 A1* | 5/2019 | Shino ............ H03K 19/017509 370/412 |
| 2020/0103992 A1* | 4/2020 | Sauer .................. G06F 3/04184 |
| 2020/0372939 A1* | 11/2020 | Bhaskaran ........... G11C 29/848 |

\* cited by examiner

FIG. 8 ature of many electronic devices, USB 2.0 communication is commonly used for low-frequency user data. However, many existing USB 2.0 modules typically cannot handle very large ground offsets, unless AC coupling is used.

INTERFACE MODULE WITH LOW-LATENCY COMMUNICATION OF ELECTRICAL SIGNALS BETWEEN POWER DOMAINS

CROSS REFERENCE TO RELATED APPLICATIONS

This application claims priority under 35 U.S.C. 119(e) to U.S. Provisional Application Ser. No. 63/197,637, entitled "Interface Module with Low-Latency Communication of Electrical Signals Between Power Domains," by Mohammad Radfar et al., filed on Jun. 7, 2021, the contents of both of which are herein incorporated by reference.

FIELD

The present disclosure relates to techniques for communicating electrical signals, including direct current (DC) content, between power domains.

BACKGROUND

Currently, Universal Serial Bus (USB) is the standard charging format for many handheld electronic devices. There are three standard sizes of USB connectors: standard for desktops or portable equipment; mini for mobile equipment; and micro for smart devices and tablets. In addition to charging electronic devices, USB is also capable of five speeds of data transfer: low, full, high, superspeed, and superspeed+. Unlike many other data buses (such as Ethernet), USB has direct connections, which means that a host electronic device has downstream facing ports that connect to the upstream ports of electronic devices.

Figure 1:
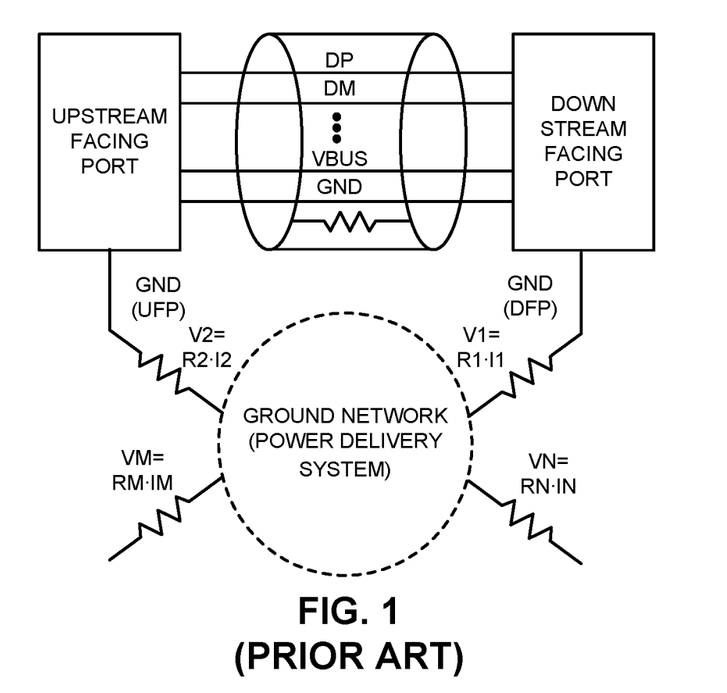
FIG. 1 is a block diagram illustrating an example of an existing circuit with a ground-voltage difference.

Moreover, significant ground voltage difference between USB 2.0 modules can occur because power delivery/charging configurations share the same bus to communicate electrical signals. This is illustrated in FIG. 1, which shows an existing circuit in which a ground-voltage difference higher than a USB standard can occur in complex ground network of power delivery systems. For example, a ground-voltage difference may occur because of a ground loop between a host controller (such as a computer) and an end point (such as a peripheral) at different locations (which are electrically coupled by a cable). Moreover, while USB Type-C power delivery specifications limit the ground voltage offset because of the voltage drop in a single charging cable (e.g., to 250 mV), the offset value can increase in multiple power delivery configurations up to the point where the communication cannot be recovered. Furthermore, the ground offset may limit the amplitudes of communicated electrical signals because of the leakage over the input range of on-chip electro-static discharge (ESD) diodes and receivers.

Furthermore, in many existing circuits, the level-shifting issue is often addressed using series capacitors for AC coupling. However, in many communication standards (such as USB 2.0), electrical signals convey or carry information over the whole frequency spectrum, from DC to a high-speed signal frequency. In these applications, the use of AC-coupling capacitors will block the DC component of the electrical signals, which typically makes these approaches unsuitable. Similarly, attempting to address ground-offset voltages associated with ground loops using a transformer or opto-electric coupling will also block the DC component of the electrical signals.

SUMMARY

Embodiments of an integrated circuit are described. This integrated circuit, includes an interface module with: a digital controller in a first power domain; a first analog front end (AFE) circuit in a second power domain; and up/down level shifters that communicate electrical signals that include a DC component from the first power domain to the second power domain.

Note that the interface module may be compatible with a USB 2.0 standard.

Moreover, the interface module does not include a series capacitor.

Furthermore, the interface module may include a second AFE circuit in the second power domain.

Additionally, the up/down level shifters may include buffers.

In some embodiments, the digital controller may communicate electrical signals via a parallel digital interface.

Note the first AFE circuit may electrically couple to signal lines that are external to the interface module, and may serially drive or receive electrical signals on the signal lines.

Moreover, the interface module may include: a first voltage regulator in the first power domain; and a second voltage regulator in the second power domain.

Furthermore, the first AFE circuit may electrically couple to signal lines that are external to the interface module, and the first voltage regulator and the second voltage regulator may receive power via the signal lines.

Additionally, for electrical signals having an allowed latency exceeding a predefined value, the up/down level shifters may use level-shifted electrical signals to drive a message between the first power domain and the second power domain and to update state information. In some embodiments, the interface module may include a memory that stores the state information. Note that a number of the up/down level shifters may be less than a number of the electrical signals, and the message may be driven serially between the first power domain and the second power domain.

Another embodiment provides an electronic device that includes the integrated circuit.

Another embodiment provides a system that includes the integrated circuit.

Another embodiment provides a method for communicating electrical signals that include a DC component from a first power domain to a second power domain. This method includes at least some of the operations performed by the interface module.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit is described. This integrated circuit may include: an interface module with a first power domain and a second power domain. The first power domain may include a digital controller, and the second power domain may include a first analog front end (AFE) circuit. Moreover, the interface module may include up/down level shifters that communicate electrical signals that include a DC component from the first power domain to the second power domain. In some embodiments, the integrated circuit may provide a fully on-chip solution to handle level shifting between the AFE circuit and a digital controller in Universal Serial Bus (USB) 2.0 during communication of electrical signals in a full-speed mode and/or a high-speed mode.

By communicating the electrical signals between the first power domain and the second power domain, these circuit techniques may allow the DC component to be conveyed even in the presence of significant ground voltage differences. This capability may allow USB 2.0 modules to be used in a variety of power delivery/charging configurations, while allowing the electrical signals to be recovered in the second power domain. Notably, the circuit techniques may avoid the use of series capacitors, a transformer or opto-electric coupling. This may simplify and reduce the cost of the interface module and may improve the communication performance. Consequently, the circuit techniques may make USB 2.0 modules more robust and reliable, and thus may facilitate the use of USB 2.0 in a wide variety of systems, electronic devices and applications.

Figure 2:
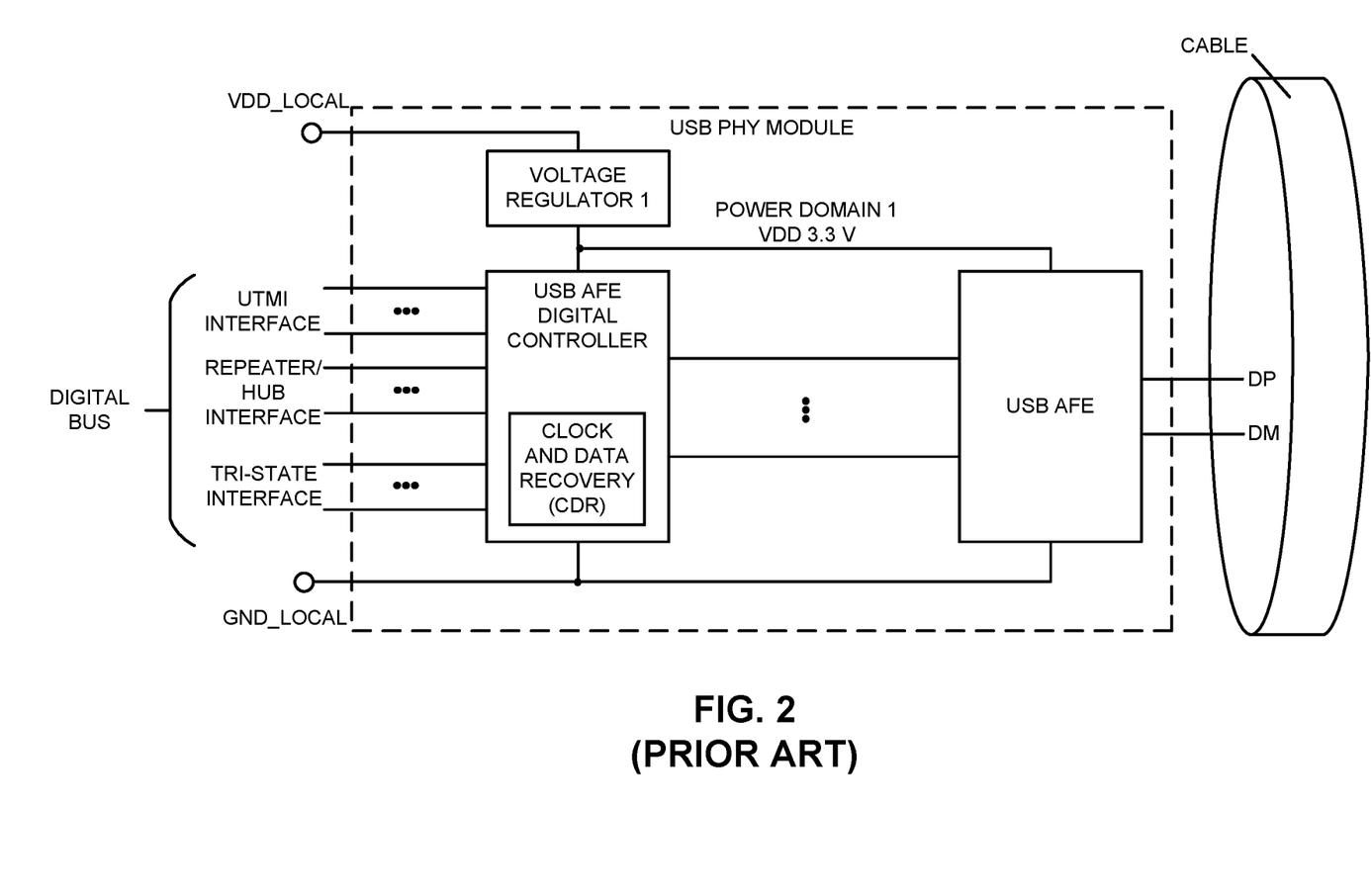
FIG. 2 is a block diagram illustrating an existing communication module.

We now describe embodiments of the circuit techniques. FIG. 2 presents a block diagram illustrating an existing communication module. Notably, this communication module may be an USB 2.0 Transceiver Macrocell Interface (UTMI). Note that the communication module may include an AFE circuit and a digital controller. In some embodiments, the communication module optionally includes a voltage regulator.

Figure 3:
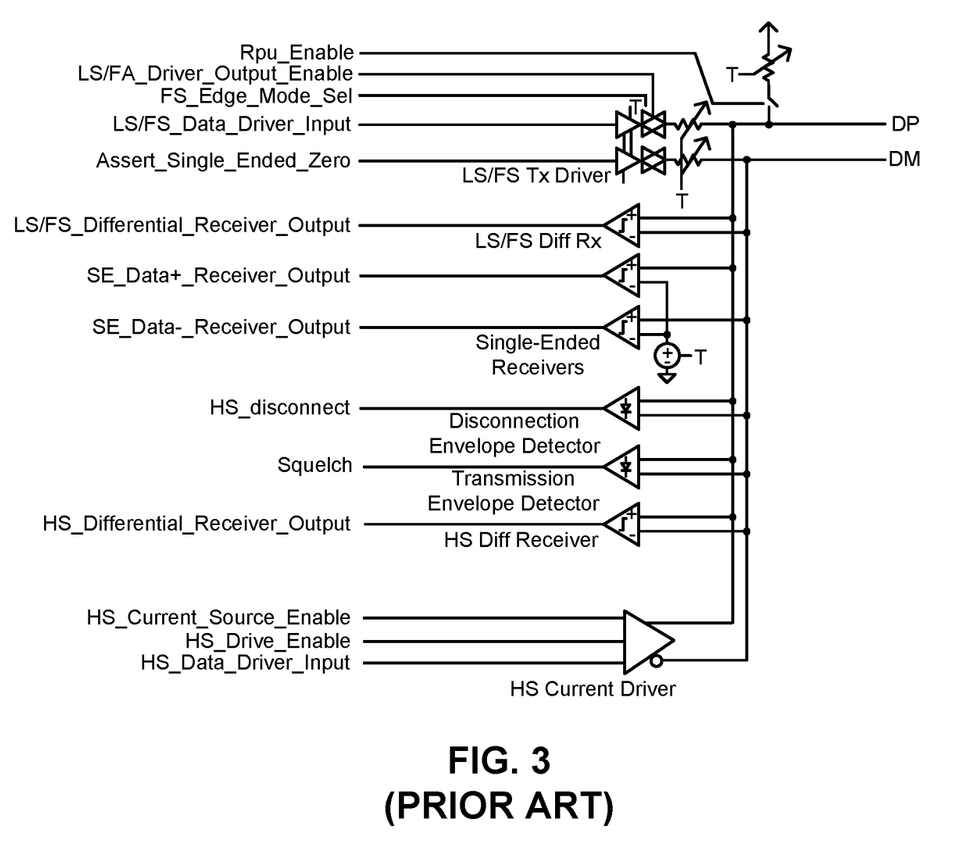
FIG. 3 is a block diagram illustrating an existing upstream-facing port in the Universal Serial Bus (USB) analog front end (AFE) circuit of FIG. 2.

Moreover, FIG. 3 presents a block diagram illustrating an existing upstream-facing port in the USB AFE circuit of FIG. 2. This upstream-facing port may include multiple circuits that transmit and receive electrical signals on a positive data terminal/a negative data terminal (DP/DM) signal pair. Note the cable that includes this DP/DM signal pair also includes ground. In addition, note that the circuits in the USB AFE circuit are signal repeaters. Therefore, these circuits do not store and recover the electrical signals. Instead, the electrical signals are transmitted or received with little or no latency. However, as a consequence, it is difficult to address potential ground loops in different power domains with series capacitors, while conveying the DC component of electrical signals, by upconverting the electrical signals and subsequently rectifying the communicated electrical signals to recover the DC component.

In FIG. 3, there are multiple locations where a ground-offset voltage can adversely impact the circuits in the USB AFE circuit. For example, the pullup resistor on DP for upstream signaling is supposed to apply +3.3 V relative to the cable ground. However, if the cable ground is offset or shifted (e.g., by up to 2 V), incorrect signaling may result. Moreover, for a low-speed/full-speed signaling mode, in the driver for the DP/DM signal pair, a 'low' electrical signal is 0 V relative to the cable ground, while a 'high' electrical signal is 3.3 V relative to the cable ground. Furthermore, for a high-speed signaling mode, in the driver for the DP/DM signal pair, a 'low' electrical signal is 0 V relative to the cable ground, while a 'high' electrical signal is 0.4 V relative to the cable ground. In addition, there is a cross-over differential signal relative to the cable ground. Once again, if the cable ground is offset or shifted, incorrect signaling may result.

In principle, the impact of the cable ground on the comparator receive circuits is different. However, if there is a large cable-ground offset, it may be difficult to implement these high-speed receive circuits because of the common-mode range. Furthermore, the cable terminators in the current source and the multiplexers in the USB AFE circuit are supposed to have a 90Ω differential impedance. These cable terminators drive current into the DP/DM signal pair for driver mode J or K, and provide no current for driver mode SE0. Once again, if the cable ground is offset or shifted, the incorrect voltage drop may occur.

Figure 4:
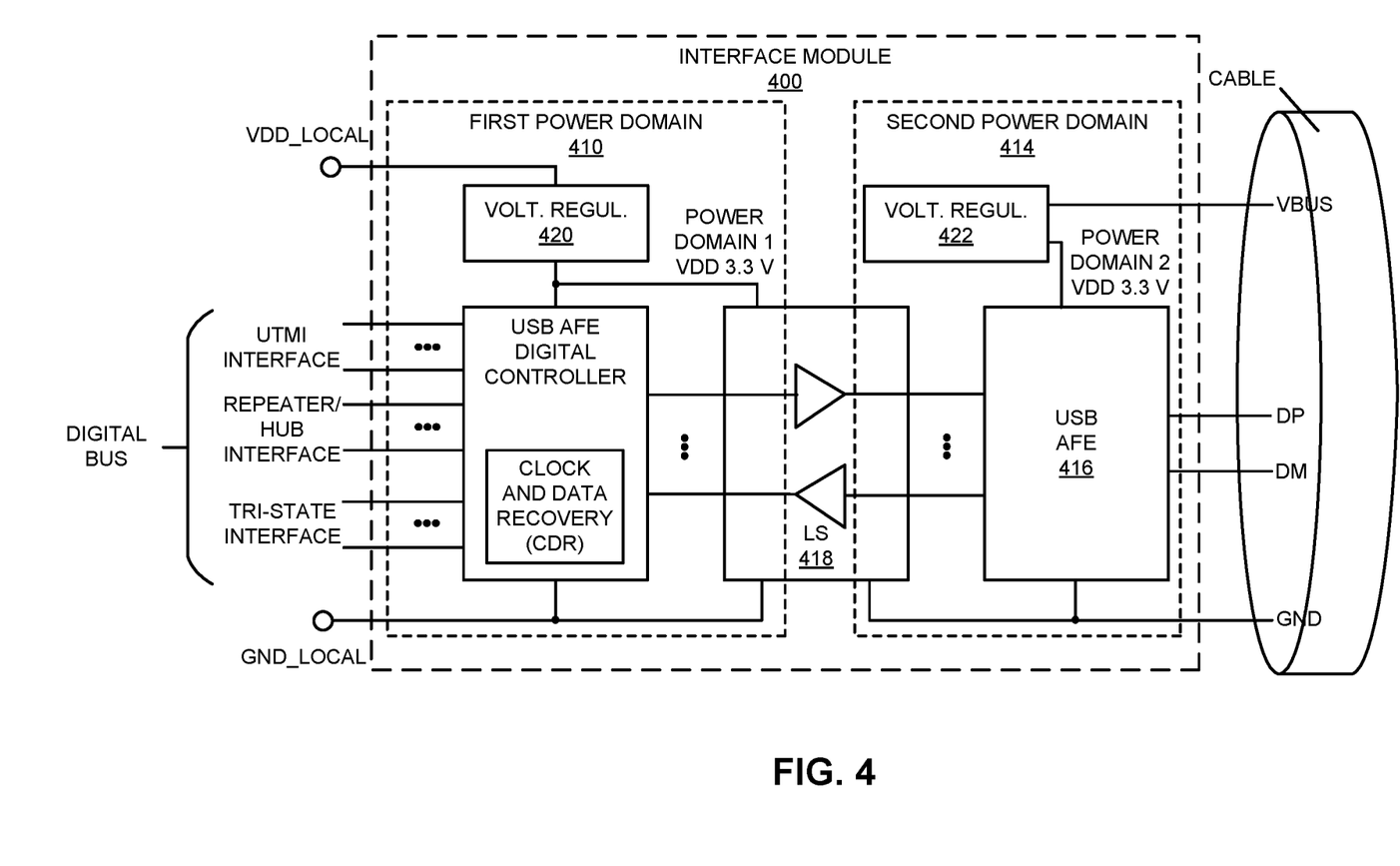
FIG. 4 is a block diagram illustrating an example of an interface module according to some embodiments of the present disclosure.

FIG. 4 presents a block diagram illustrating an example of an interface module 400 according to some embodiments of the present disclosure. This interface module may include a first power domain 410 with a digital controller 412, and a second power domain 414 with an AFE circuit 416. Moreover, interface module 400 may include up/down level shifters (LS) 418 that convey electrical signals, including DC components, between the first power domain 410 and the second power domain 414. For example, up/down level shifters 418 may include buffers. In some embodiments, a given level shifter may transform a single-ended electrical signal into a differential electrical signal, which is received differentially across the power-domain boundary between the first power domain 410 and the second power domain 414 and is then converted back to a single-ended electrical signal. Thus, up/down level shifters 418 may electrically isolate the first power domain 410 and the second power domain 414. Note that interface module 400 may be compatible with a USB standard, such as USB 2.0. Therefore, up/down level shifters 418 may convey the electrical signals, including the DC components, at a bit rate of a USB standard, such as: low speed (1.5 Mb/s), full speed (12 Mb/s) or high speed (480 Mb/s). In some embodiments, the first power domain includes voltage regulator 420 and the second power domain 414 includes voltage regulator 422.

Figure 5:
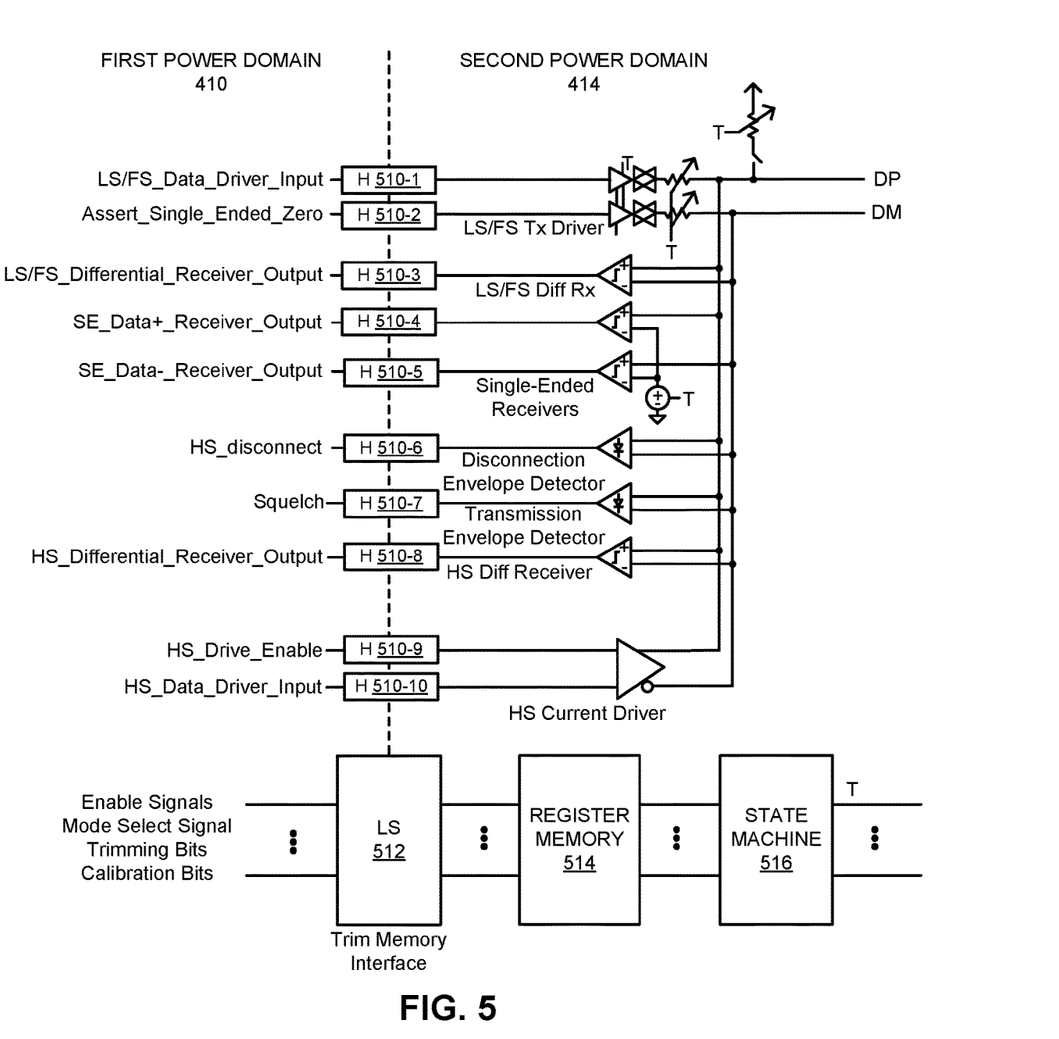
FIG. 5 is a block diagram illustrating an example of the impact of up/down level shifters on transmitting and receiving of electrical signals in the interface module of FIG. 4 according to some embodiments of the present disclosure.

FIG. 5 presents a block diagram illustrating an example of the impact of up/down level shifters 510 and 512 on transmitting and receiving of electrical signals in interface module 400 according to some embodiments of the present disclosure. Notably, FIG. 5 may illustrate a USB 2.0 interface module with up/down level shifters 510 and 512 that correct for ground-offset voltages. In FIG. 5, the components labeled 'H' may be low-latency (high-speed) level shifters (LS) 510, with delays in the nanosecond range and jitter in the picosecond range, and there may be trim or calibration signals applied at the locations labeled 'T'. For example, the total delay of hub electronics and the associated transmission line may be a maximum of 44 ns (when the hub has a detachable USB cable), and the total hub differential driver jitter (for pair transition) may be within ±1 ns jitter. Low-latency level shifters 510 may consume a small fraction of the delay and jitter budget. Note that up/down level shifters 510 and/or 512 may be controlled using a register memory 514 and a state machine 516, which are configured via a trim memory interface 518. This trim memory interface may include: enable signals, a mode select signal, trim bits, and calibration bits. In some embodiments, the calibration may adjust the high-speed mode termination resistance to 45Ω (because process variation may be larger than the specification range), and the trim may set or define: receiver comparators threshold voltage values, high-speed transmitter current source bias, etc.

For example, in FIG. 5, electrical signals for data packets (such as hs_txse0) may have ultra-low latency. In some embodiments, these electrical signals may be multiplexed. However, some electrical signals (such as fs_term, fs_ena, and hs_ena) may change slowly (such as when there is a change in the power state). In addition, the trim bits and the calibration bits may change slowly.

In some embodiments, the circuit techniques may create a message interface to serialize a smaller number of messages to register memory 514, which are stored and then driven across the boundary between the first power domain 410 and the second power domain 414. For example, for electrical signals having an allowed latency exceeding a predefined value (such as the slowly changing electrical signals and the trim and calibration bits), up/down level shifters 510 and/or 512 may use level-shifted electrical signals to drive a message between the first power domain 410 and the second power domain 414 and to update state information, e.g., in a 32-bit register memory. Note that a number of up/down level shifters 510 and/or 512 may be less than a number of the electrical signals, and the message may be driven serially between the first power domain 410 and the second power domain 414.

Figure 6:
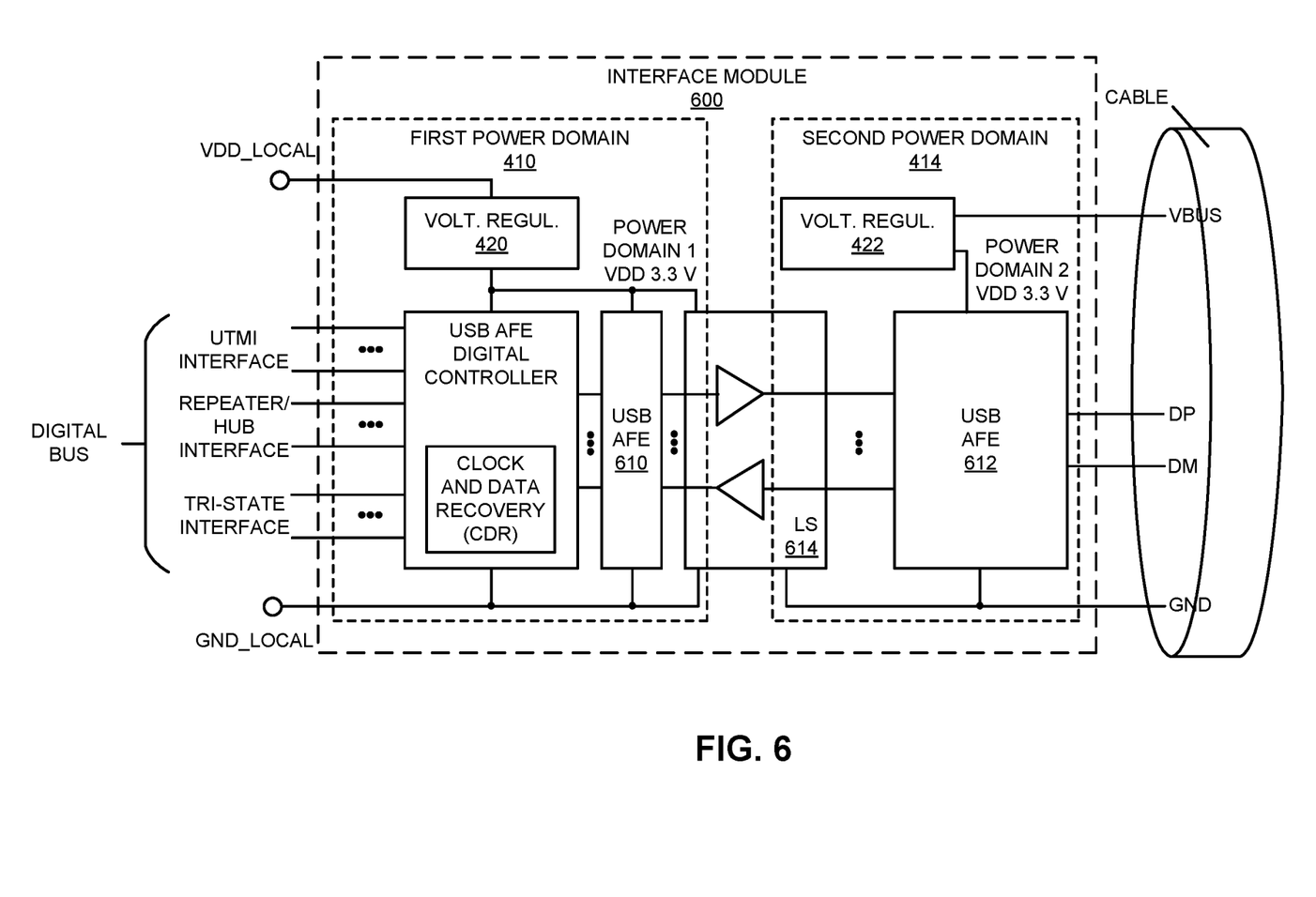
FIG. 6 is a block diagram illustrating an example of an interface module according to some embodiments of the present disclosure.

While the preceding embodiments illustrated the interface module with a power-domain boundary between the digital controller and the AFE circuit, in other embodiments, at least a portion of the AFE circuit may be included in the first power domain. Notably, the power-domain boundary and, thus, the up/down level shifters may between a first portion of the AFE circuit in the first power domain and a second portion of the AFE circuit in the second power domain. This is shown in FIG. 6, which presents a block diagram illustrating an example of an interface module 600 according to some embodiments of the present disclosure. Notably, interface module 600 includes a first portion of the AFE circuit (AFE circuit 610) in the first power domain 410 and a second portion of the AFE circuit (AFE circuit 612) in the second power domain 414. Moreover, the electrical signals may be communicated across the power-domain boundary between the first power domain 410 and the second power domain 414 using up/down level shifters (LS) 614.

Figure 7:
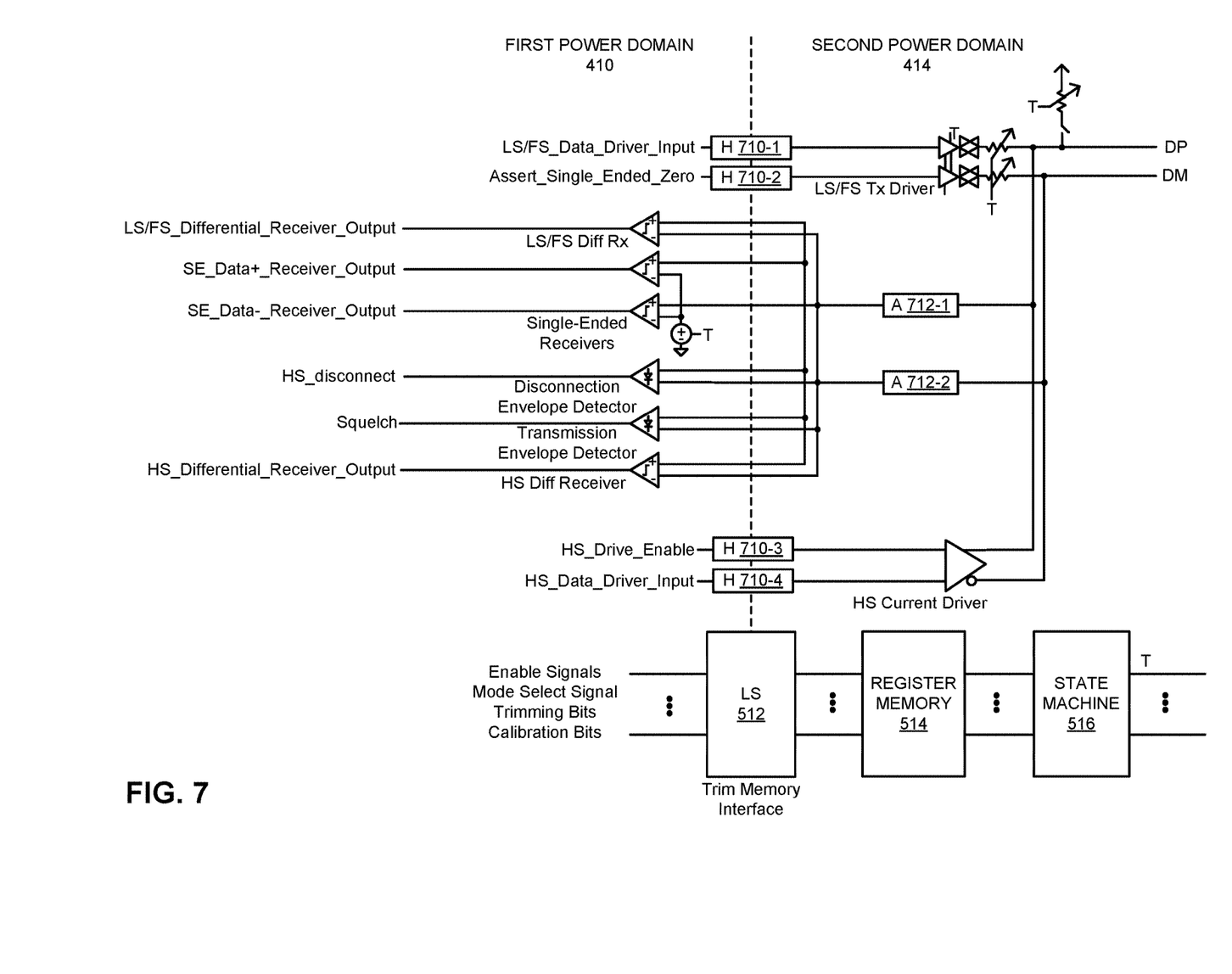
FIG. 7 is a block diagram illustrating an example of the impact of up/down level shifters on transmitting and receiving of electrical signals in the interface module of FIG. 6 according to some embodiments of the present disclosure.

FIG. 7 presents a block diagram illustrating an example of the impact of up/down level shifters on transmitting and receiving of electrical signals in interface module 600 according to some embodiments of the present disclosure. In FIG. 7, the components labeled 'H' may be low-latency level shifters 710, with delays in the nanosecond range and jitter in the picosecond range, the components labeled 'A' may implement high-speed analog common mode shifting 712 or adjustments, and there may be trim or calibration signals applied at the locations labeled 'T'.

Figure 8:
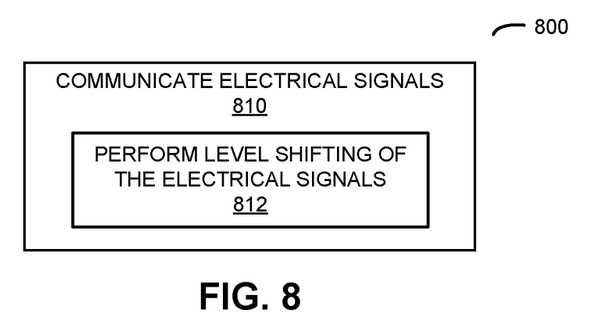
FIG. 8 is a flow diagram illustrating an example of a method for communicating electrical signals that include a DC component from a first power domain to a second power domain according to some embodiments of the present disclosure.

We now describe embodiments of a method. FIG. 8 presents a flow diagram illustrating an example of a method 800 for communicating electrical signals that include a DC component from a first power domain to a second power domain using an interface module, such as interface module 400 (FIG. 4) or interface module 600 (FIG. 6). During operation, the interface module may communicate the electrical signals (operation 810) that include the DC component from a digital controller in the first power domain to a first AFE in the second power domain. Moreover, the communicating (operation 810) may include performing level shifting, using up/down level shifters, of the electrical signals (operation 812) that include the DC component from the first power domain to the second power domain.

In some embodiments of the method 800, there may be additional or fewer operations. Moreover, the order of the operations may be changed, and/or two or more operations may be combined into a single operation.

The disclosed interface module and the circuit techniques can be (or can be included in) any electronic device or system. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the interface module and/or the integrated circuit that includes the interface module, in alternative embodiments different components and/or subsystems may be present in the interface module and/or the integrated circuit that includes the interface module. Thus, the embodiments of the interface module and/or the integrated circuit that includes the interface module may include fewer components, additional components, different components, two or more components may be combined into a single component, a single component may be separated into two or more components, one or more positions of one or more components may be changed, and/or there may be different types of components.

Moreover, the circuits and components in the embodiments of the interface module and/or the integrated circuit that includes the interface module may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
an interface module comprising:
a digital controller in a first power domain;
a first analog front end (AFE) circuit in a second power domain; and
up/down level shifters configured to communicate electrical signals that include a DC component from the first power domain to the second power domain, wherein, for electrical signals having an allowed latency exceeding a predefined value, the up/down level shifters are configured to use level-shifted electrical signals to drive a message between the first power domain and the second power domain and to update state information, and
wherein the communication of the electrical signals from the first power domain to the second power domain by a given level shifter in the up/down level shifters comprises transforming a single-ended electrical signal into a differential electrical signal, which is received differentially across the power-domain boundary between the first power domain and the second power domain and is then converted back to a single-ended electrical signal.

2. The integrated circuit of claim 1, wherein the interface module is compatible with a Universal Serial Bus (USB) 2.0 standard.

3. The integrated circuit of claim 1, wherein the interface module does not include a series capacitor.

4. The integrated circuit of claim 1, wherein the interface module comprises a second AFE circuit in the second power domain.

5. The integrated circuit of claim 1, wherein the up/down level shifters comprise buffers.

6. The integrated circuit of claim 1, wherein the digital controller is configured to communicate electrical signals with a second electronic device via a parallel digital interface.

7. The integrated circuit of claim 1, wherein the first AFE circuit is configured to electrically couple to signal lines that are external to the interface module, and is configured to serially drive or receive electrical signals on the signal lines.

8. The integrated circuit of claim 1, wherein the interface module comprises:
a first voltage regulator in the first power domain; and
a second voltage regulator in the second power domain.

9. The integrated circuit of claim 8, wherein the first AFE circuit is configured to electrically couple to signal lines that are external to the interface module, and the first voltage regulator and the second voltage regulator are configured to receive power via the signal lines.

10. The integrated circuit of claim 1, wherein the interface module comprises a memory configured to store the state information.

11. The integrated circuit of claim 1, wherein a number of the up/down level shifters is less than a number of the electrical signals, and the message is driven serially between the first power domain and the second power domain.

12. A system, comprising:
an integrated circuit comprising an interface module, wherein the interface module comprises:
a digital controller in a first power domain;
a first analog front end (AFE) circuit in a second power domain; and
up/down level shifters configured to communicate electrical signals that include a DC component from the first power domain to the second power domain, wherein, for electrical signals having an allowed latency exceeding a predefined value, the up/down level shifters are configured to use level-shifted electrical signals to drive a message between the first power domain and the second power domain and to update state information, and wherein the communication of the electrical signals from the first power domain to the second power domain by a given level shifter in the up/down level shifters comprises transforming a single-ended electrical signal into a differential electrical signal, which is received differentially across the power-domain boundary between the first power domain and the second power domain and is then converted back to a single-ended electrical signal.

13. The system of claim 12, wherein the interface module is compatible with a Universal Serial Bus (USB) 2.0 standard.

14. The system of claim 12, wherein the interface module does not include a series capacitor.

15. The system of claim 12, wherein the up/down level shifters comprise buffers.

16. The system of claim 12, wherein the digital controller is configured to communicate electrical signals via a parallel digital interface.

17. A method for communicating electrical signals that include a DC component from a first power domain to a second power domain, comprising:

by an interface module:

communicating the electrical signals that include the DC component from a digital controller in the first power domain to a first analog front end (AFE) in the second power domain, wherein the communicating comprises performing level shifting, using up/down level shifters, of the electrical signals that include the DC component from the first power domain to the second power domain, wherein, for electrical signals having an allowed latency exceeding a predefined value, the up/down level shifters use level-shifted electrical signals to drive a message between the first power domain and the second power domain and to update state information, and wherein the communicating of the electrical signals from the first power domain to the second power domain by a given level shifter in the up/down level shifters comprises transforming a single-ended electrical signal into a differential electrical signal, which is received differentially across the power-domain boundary between the first power domain and the second power domain and is then converted back to a single-ended electrical signal.

18. The method of claim 17, wherein the interface module is compatible with a Universal Serial Bus (USB) 2.0 standard.

* * * * *